United States Patent
Tzu et al.

(10) Patent No.: US 6,277,528 B1
(45) Date of Patent: Aug. 21, 2001

(54) METHOD TO CHANGE TRANSMITTANCE OF ATTENUATED PHASE-SHIFTING MASKS

(75) Inventors: San-De Tzu; Wei-Zen Chou, both of Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/489,499

(22) Filed: Jan. 21, 2000

(51) Int. Cl.[7] .................................................... G03F 9/00
(52) U.S. Cl. ........................................................ 430/5
(58) Field of Search .............................. 430/5, 322, 323, 430/324; 216/95, 96

(56) References Cited

U.S. PATENT DOCUMENTS

| | | | |
|---|---|---|---|
| 5,503,951 | 4/1996 | Flanders et al. | 430/5 |
| 5,601,954 | 2/1997 | Krivokapic et al. | 430/5 |
| 5,614,335 | 3/1997 | Hashimoto et al. | 430/5 |
| 5,618,643 | 4/1997 | Dao et al. | 430/5 |
| 5,667,919 | 9/1997 | Tu et al. | 430/5 |
| 5,786,114 | 7/1998 | Hashimoto | 430/5 |
| 5,789,116 | 8/1998 | Kim | 430/5 |
| 5,792,578 | 8/1998 | Tzu et al. | 430/5 |
| 5,795,682 | 8/1998 | Garza | 430/5 |
| 5,869,212 | 2/1999 | Hashimoto | 430/5 |

*Primary Examiner*—Stephen Rosasco
(74) *Attorney, Agent, or Firm*—George O. Saile; Stephen B. Ackerman; William J. Stoffel

(57) ABSTRACT

A method of forming a high transmittance attenuated phase-shifting mask blank, comprising the following steps. An attenuated phase-shifting mask is provided that includes a shifter layer overlying a transparent substrate. The attenuated phase-shifting mask having a first transmittance and an initial phase angle. The attenuated phase-shifting mask and more specifically the shifter layer is treated with an aqueous solution of $NH_4OH:H_2O_2$ for a first predetermined time increasing the first transmittance to a second transmittance and decreasing the initial phase angle to a second phase angle. The attenuated phase-shifting mask is then treated with a selected acid or base for a second predetermined time increasing the second transmittance to a third, predetermined transmittance and increasing the phase angle to a third, predetermined phase angle. The third phase angle is preferably substantially identical to the initial phase angle.

19 Claims, 4 Drawing Sheets

METHOD TO CHANGE TRANSMITTANCE OF ATTENUATED PHASE-SHIFTING MASKS

FIELD OF THE INVENTION

The present invention relates generally to the fabrication of photomasks and more specifically to fabrication of attenuated phase-shifting masks used in photolithography processes to form microminiaturized integrated circuits in semiconductor devices.

BACKGROUND OF THE INVENTION

As integrated circuits in semiconductor devices decrease in size, the photomasks used to fabricate such integrated circuits must permit formation of these smaller and smaller integrated circuits and devices. Attenuated phase-shifting masks (APSM) are one type of photomask that have been developed to allow fabrication of microminiaturized integrated circuits by lithography processes. APSMs have a mask pattern, formed on a transparent substrate, comprising a light, or radiation, transmittable portion through which a light is transmitted that has such an intensity as to substantially contribute to the exposure, and a light semi-transmittable portion, generally comprised of a shifter layer, through which a light is transmitted that has such an intensity as not to substantially contribute to the exposure. APSMs are constituted so as to substantially invert to the phase of the light passed through the light semi-transmittable portion so that the light passed through the neighborhood of a boundary between the light transmittable portion and the light semi-transmittable portion can be mutually offset and the contrast of the boundary can be successfully maintained.

This destructive interference at the edges of the patterned shifter layer provide for sharper edged devices to be formed on the semiconductor structure that are vital for microminuatized integrated circuits. The shifter layer is only partially transmissive to light because if the transmitted radiation is too intense, it would expose a photoresist layer making patterning difficult.

Due to bad chemical durability, only 6% transmittance shifters are commercially available for deep ultraviolet (DUV) APSM fabrication. For 0.2 μm contact holes, for example, insufficient depth of focus is achieved for only a 6% transmittance APSM. Depth of focus (DOF) refers to when the foreground is in focus while the background is out of focus, or visa versa. This occurs in normal photography as well with the wavelengths used in patterning microminuatized integrated circuits through photolithography. Even the micron and sub-micron sized topography on a wafer is sufficient to cause depth of focus problems.

U.S. Pat. No. 5,789,116 to Kim describes halftone phase-shift masks having a high transmittance that comprise a transparent substrate, a phase shifter pattern formed on the substrate and a phase shifting groove that can be formed by etching the transparent substrate.

U.S. Pat. No. 5,792,578 to Tzu et al. describes a method of forming a double layer attenuating phase-shifting mask with a first and second resist that avoid having to withstand dry etching by the use of a pellicle that restricts the deposition of the second resist to the alignment region of the mask. Cleaning agents such as $H_2O_2+H_2SO_4$ followed by $H_2O+NH_4OH+H_2O_2$ or the like may be used to thoroughly clean the mask after the layer of first resist is removed.

U.S. Pat. No. 5,503,951 to Flanders et al. describes an attenuating phase-shift, semiconductor fabrication mask having recessed attenuating and phase-shifting regions that is not susceptible to phase defects in the printing regions of the mask. The surfaces of the fully transmissive regions of the mask are not altered and the attenuating regions of the mask are recessed relative to the fully transmissive regions.

U.S. Pat. No. 5,618,643 to Dao et al. describes a method and apparatus for fabricating an attenuated phase-shifting mask for use in patterning a radiation sensitive layer in a lithographic printer. In one embodiment a layer of embedded phase shift material overlies a transparent base material and attenuates the radiation and changes the phase of transmitted radiation by amounts other than 160–200°. Subsequent processing to the base material is performed to result in a net 180° phase difference between radiation transmitted by the phase shift layer and the transparent base material. Such processing of the base material may be accomplished by subsequent etching of the quartz base.

U.S. Pat. No. 5,614,335 to Hashimoto et al. describes a halftone phase-shift photomask and a blank thereof which enables the transmittance of a phase shift portion to be varied between 1% to 50% even after blank or photomask fabrication. This is accomplished by exposing the blank or photomask to a high temperature elevated to at least 150° C.; to an oxidizing atmosphere; or to a reducing atmosphere in a step that can be independent from the film-forming or photomask fabrication steps.

U.S. Pat. No. 5,667,919 to Tu et al. describes an APSM and a APSM blank each having a tantalum-silicon oxide blanket semitransparent shifter layer formed over a transparent substrate. The tantalum-silicon oxide having the formula:

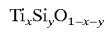

$$Ti_xSi_yO_{1-x-y}$$

where 0,10<x<0,3 and 0,03<y<0.1.

U.S. Pat. No. 5,601,954 to Krivokapic et al. describes a process of fabricating an attenuated phase-shifting mask having a first layer with a thickness to provide a 3 to 10% transmittance formed on a transparent substrate. A second layer is formed over the first layer and has a thickness to provide a desired phase shift. For a phase shift of 180° and i-line wavelength (365 nm), chromium is used as the first layer having a thickness of from 25 to 75 nm and silicon dioxide is used as the second layer having a thickness of from 400 to 450 nm. The chromium and silicon dioxide layers are etched, preferably by an isotropic wet etch, to form parabolically shaped sidewalls in the silicon dioxide layer that more efficiently focuses the light through the opening in the thin chromium layer.

U.S. Pat. No. 5,869,212 to Hashimoto describes an attenuated phase-shifting mask employing regions of increased light transmissivity adjacent the defined circuit pattern features which improves image resolution and depth of focus, with a minimization of image shortening effects. These regions may be provided by partially oxidizing a secondary region of the halftone masking layer. In an alternate embodiment sharper corner definition may be also be obtained by providing a generally rounded, light diffracting topography at edges of the defined circuit pattern features. In the case of a line feature, the substrate can be etched to form a recessed region including a generally concave light transmissive surface extending beneath an edge portion of the masking layer.

U.S. Pat. No. 5,786,114 to Hashimoto describes an attenuated phase-shift mask having boundary regions formed from the halftone layer used to form the circuit pattern regions. The boundary regions are shielded from a stabilization treatment of the halftone layer serving to stabilize the transmittance of the circuit pattern regions at an increased optimum level. The transmittance of the boundary regions remains relatively low thus avoiding the problem of exposure light leaking to adjacent chip areas in a step and repeat or scanning exposure process. This process eliminates the extra steps required to form isolation frames and alignment marks from a separate opaque layer and avoids the need for data sensitive sub-resolution patterning.

U.S. Pat. No. 5,795,682 to Garza describes an attenuated phase-shift reticle, or mask, design having a compensating transmissive region located where side lobe ringing is anticipated to be most severe. These compensating transmissive regions, unlike other transmissive regions on the reticle, do not have defined integrated circuit features. The radiation transmitted through the compensating transmissive region is approximately 180° out of phase with the radiation giving rise to side lobe ringing so as to destructively interfere with the out of phase radiation.

SUMMARY OF THE INVENTION

Accordingly, it is an object of the present invention to provide a method of fabricating high transmission attenuated phase-shifting masks with commercially available shifter blanks.

Another object of the present invention is to provide a method of increasing transmittance of shifter layers by two independent chemical treatment steps.

A further object of the present invention is to provide a method of increasing transmittance of attenuated phase-shifting masks while maintaining an 180° out of phase radiation shift after attenuated phase-shifting mask fabrication.

Other objects will appear hereinafter.

It has now been discovered that the above and other objects of the present invention may be accomplished in the following manner. Specifically, an attenuated phase-shifting mask is provided that includes a shifter layer overlying a transparent substrate. The attenuated phase-shifting mask having a first transmittance and an initial phase angle. After mask fabrication, the whole mask including the shifter layer is treated with an aqueous solution of $NH_4OH:H_2O_2$ (SC1) for a first predetermined time increasing the first transmittance to a second transmittance and decreasing the initial phase angle to a second phase angle. The mask including the shifter layer is then treated a second time with either a base, such as NaOH or KOH or an acid such as HF acid or a buffered oxide etch (BOE) acid (HF in a buffering solution) for a second predetermined time increasing the second transmittance to a third, predetermined transmittance and increasing the phase angle to a third, predetermined phase angle. The third phase angle is preferably substantially equal to the initial phase angle of the shifter layer. The 2 treatments, (a) SC1 and (b) acid/base, affect the shifter layer, thus changing the T % and phase angle.

BRIEF DESCRIPTION OF THE DRAWINGS

The features and advantages of the method of forming a high transmittance attenuated phase-shifting mask according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, processes etc. may be formed or accomplished by conventional methods known in the prior art.

In accordance with the present invention, it is possible to change the mask transmittance (T $\%_{initial}$) to any desired value (T $\%_{final}$) while maintaining the desired 180° phase angle (or any other desired phase angle) after the subject mask attenuated phase-shifting formation (FIGS. 1 to 4), e.g. conventional APSM mask (i.e., e.g. 6% transmittance, 180° phase angle) formation.

Figure 1:
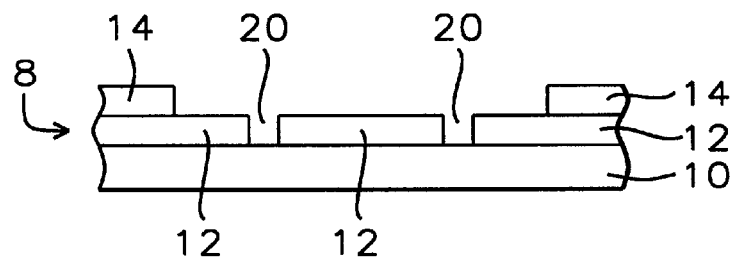
FIGS. 1 to 4 show a series of schematic cross-sectional diagrams illustrating the results of progressive stages in forming a transmittance attenuated phase-shifting mask in accordance with a preferred embodiment of the method of the present invention.

FIG. 1 shows a deep ultraviolet (DUV) attenuated phase-shifting mask (APSM) 8, comprising patterned shifter layer 12 preferably formed over transparent substrate 10 by sputtering. The APSM 8 preferably has from about 3 to 6% transmittance (T %). Shifter layer 12 may comprise MoSiO, MoSiON, or CrON and is preferably molybdenum silicon oxynitride (MoSiON). Transparent substrate 10 is preferably quartz.

Transparent substrate 10 is from about 0.6 cm to 0.7 cm thick and more preferably 0.65 cm thick, and MoSiON shifter layer 12 is from about 700 to 1500 Å thick and more preferably about 900 Å thick to preferably achieve a phase shift of 180° relative to transparent substrate 10. Shifter blank 8 may be produced or is commercially available under the trademarks MSK5™ manufactured by Hoya or a blank manufactured by Ulcoat.

ASPM 8 further includes patterned masking layer 14, preferably about 1000 Å thick of chromium (Cr), over shifter layer 12.

It is understood that the structure shown in FIG. 1 is only an example and any high transmittance APSM may be used with the present invention, for example, binary masks and rim type masks.

For purposes of illustration, attenuated phase-shifting mask 8 may have a transmittance of from about 3 to 6%, and more preferably about 6% and a phase angle of about 180° and is commercially available from the Hoya company. The phase angle refers to the shift in radiation from the nominal value of radiation transmitted through a mask area not covered by shifter layer 12 such as at openings 20.

Figure 7:
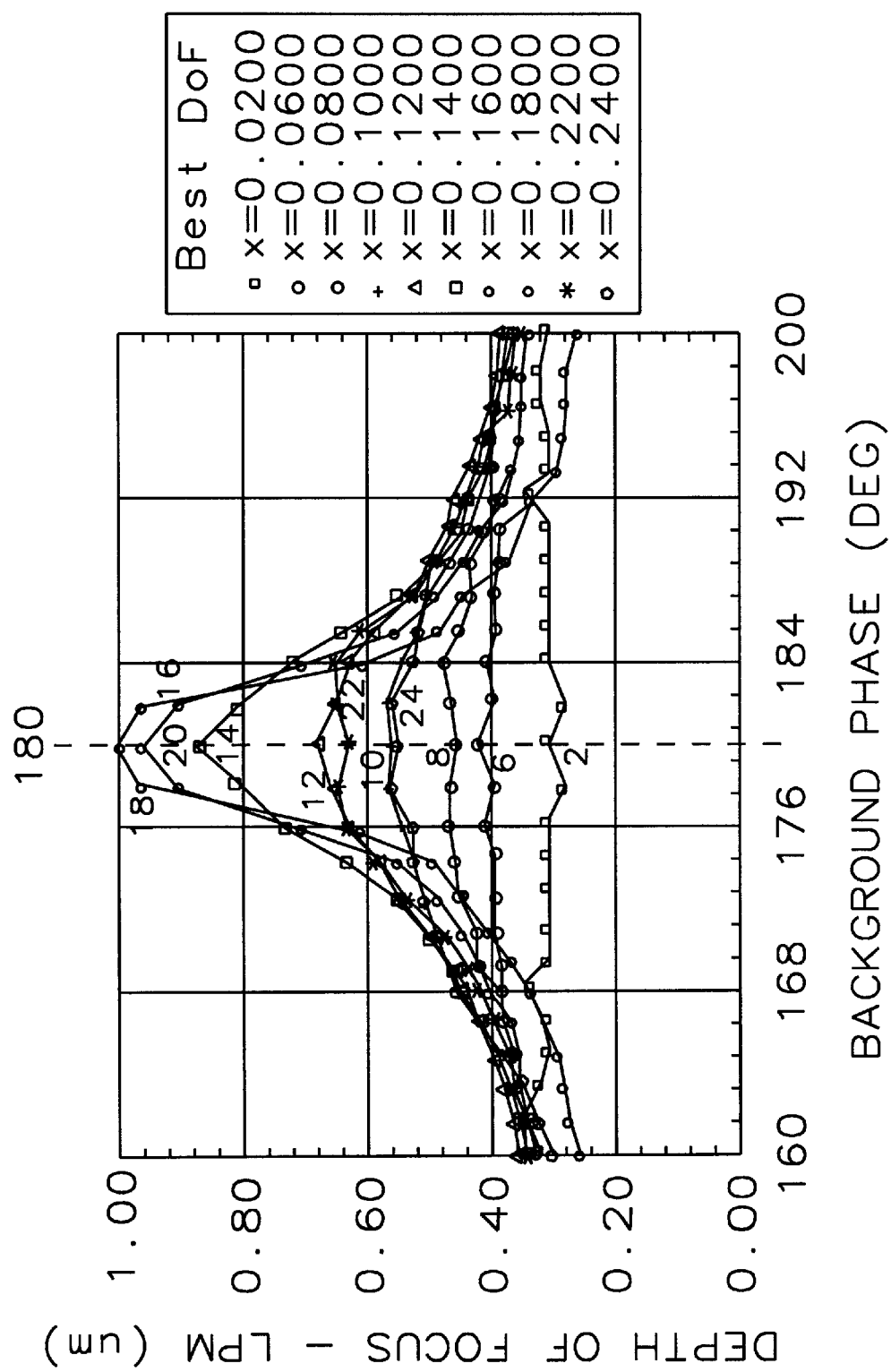
FIG. 7 is a graph plotting depth of focus (DOF) versus background phase, or phase shift for various percent transmittances for a 200 nm contact holes with a 480 nm pitch.

FIG. 7 shows the depth of focus (DOF), for 200 nm contact holes with a 480 nm pitch, plotted with respect to phase angle and percent transmittance. Simulation suggests that increasing the percent transmittance, increases the DOF. This is achieved by a first chemical treatment with SC1 for a first predetermined time (as described below in step one), and a second chemical treatment with an acid or a base, for example NaOH, for a second predetermined time (as described below in step two). These steps may be done in reverse order. For purposes of illustration, APSM 8 will be treated with SC1 in step one and then with NaOH in step two.

Step One

Figure 2:
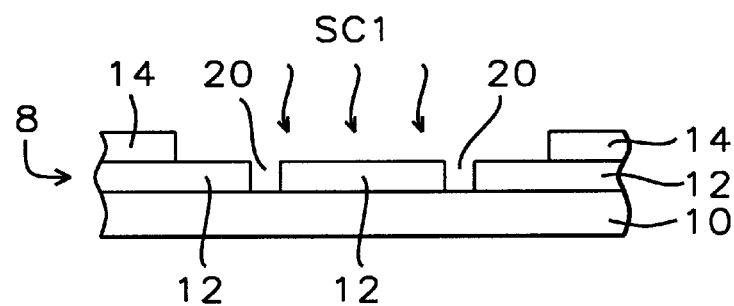

As shown in FIG. 2, shifter layer 12 of APSM 8 is chemically treated with SC1, i.e. an aqueous solution of $NH_4OH{:}H_2O_2$ in the ratio one part $NH_4OH$, one part $H_2O_2$ and five parts $H_2O$ at from about 30 to 80° C., and more preferably from about 35 to 45° C. and most preferably about 40° C. under the following additional parameters: at a power of about 400 W in a Maga-Sonic tank device for a first predetermined time t1. Differing composition ratios of aqueous $NH_4OH$ and $H_2O_2$ in the SC1 formulation would change the reaction rate T1 & P1.

Figure 5A:
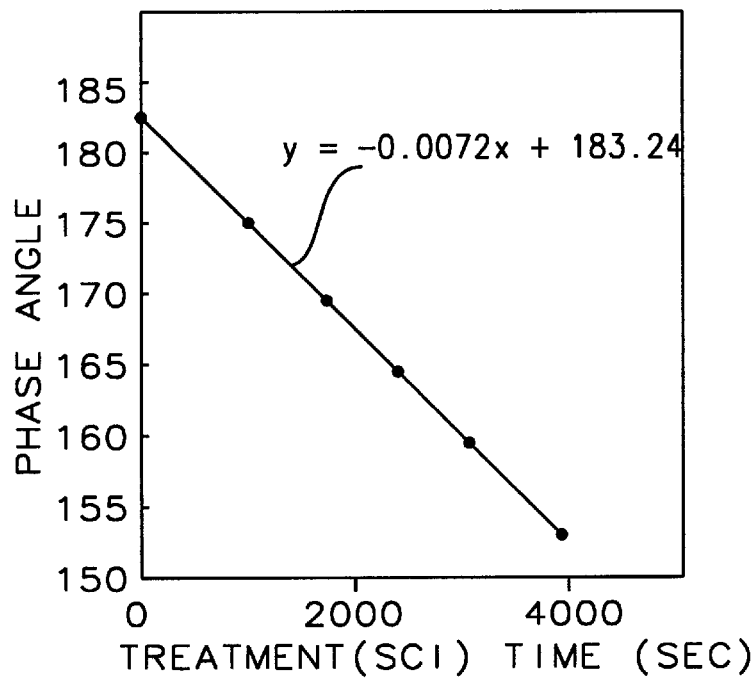
FIG. 5a is a graph plotting SC1 treatment time of the shifter layer against the change in phase angle of the shifter layer.
Figure 5B:
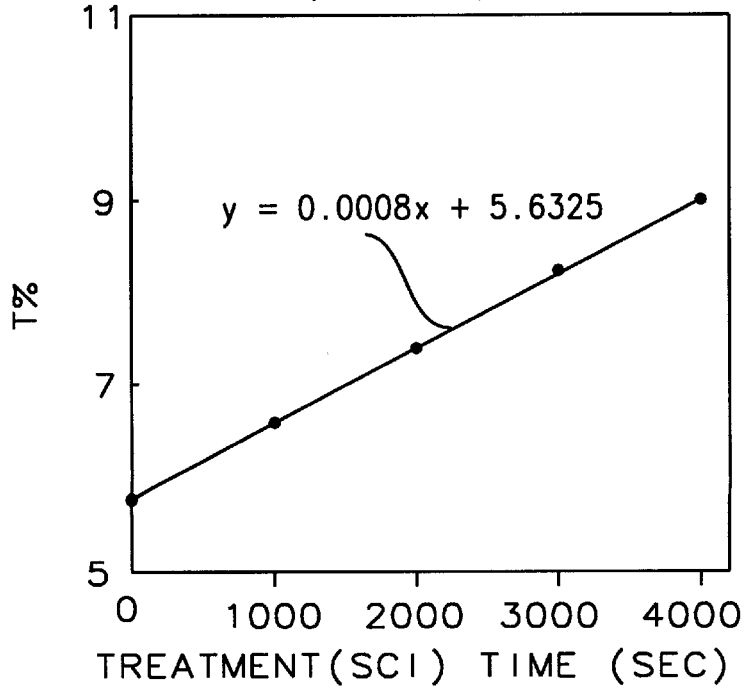
FIG. 5b is graph plotting SC1 treatment time of the shifter layer against the change in transmittance of the shifter layer.

As shown in FIG. 5*b*, the SC1 chemical treatment increases the transmittance (T %) of attenuated phase-shifting mask 8 at a transmittance change rate T1 of 0.048% transmittance/minute. However, the SC1 chemical treatment also decreases the phase angle of attenuated phase-shifting mask 8 at a phase angle change rate P1 of −0.432°/minute as shown in FIG. 5*a*.

The actual change in the transmittance of attenuated phase-shifting mask 8 after step one is from about 3 to 6% to from about 11 to 15%.

Step Two

Figure 3:
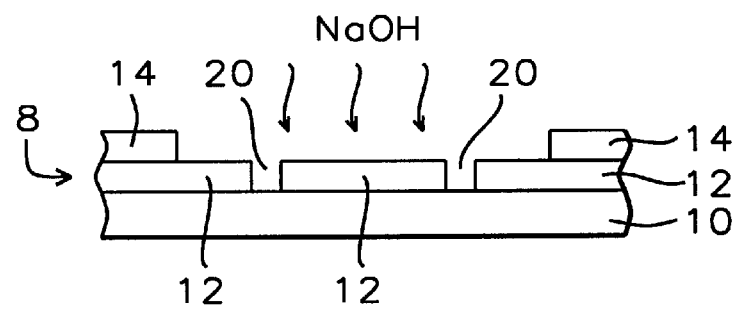

As shown in FIG. 3, APSM 8 is then chemically treated by a selected acid or a base, in this instance, for purposes of illustration, NaOH, at from about 30 to 80° C., and more preferably about 70° C., under the following additional parameters: about 5.6 mole/liter concentration of NaOH for a second predetermined time t2. The selected acid or base, in this example, NaOH, etches transparent quartz substrate 10 and shifter layer 12.

Figure 4:
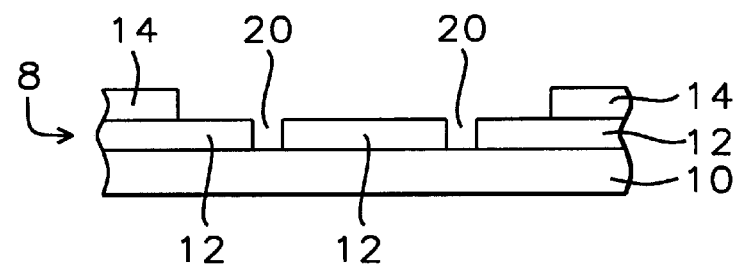

FIG. 4 illustrates a completed attenuated phase-shifting mask 8 having an increase transmittance of from about 6 to 20%, and more preferably from about 16 to 20%, and a phase angle substantially equal to the initial phase angle of the attenuated phase-shifting mask 8 of FIG. 1, preferably about 180° C.

As noted above, another base, preferably KOH, and acids preferably HF and a buffered oxide etch (BOE) may also be used.

Figure 6A:
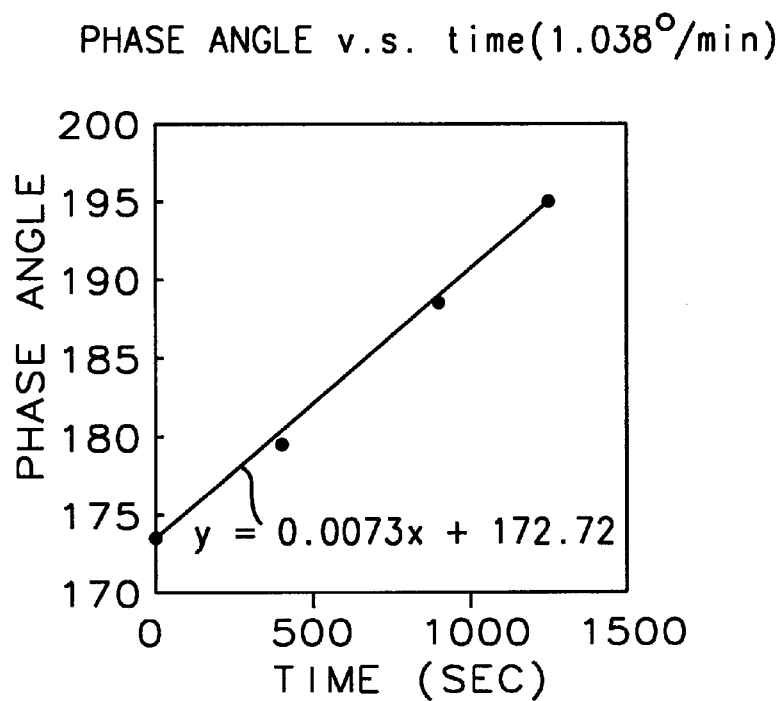
FIG. 6a is a graph plotting NaOH treatment time of the shifter layer against the change in phase angle of the shifter layer.
Figure 6B:
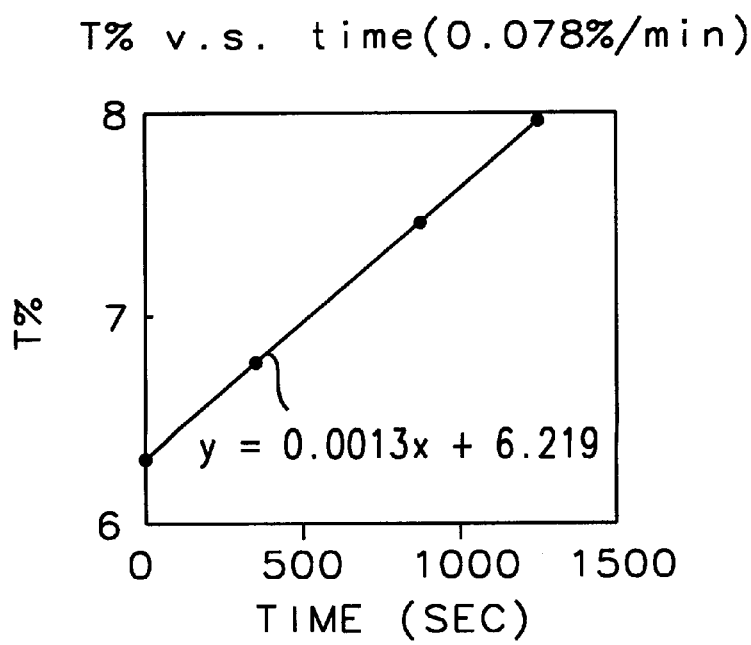
FIG. 6b is graph plotting NaOH treatment time of the shifter layer against the change in transmittance of the shifter layer.

As shown in FIG. 6*b*, the NaOH chemical treatment, for example, increases the transmittance of shifter layer 12 at a transmittance change rate T2 of 0.078% transmittance/minute and increases the phase angle of shifter layer 12 at a phase angle change rate P2 of 1.038°/minute as shown in FIG. 6*a*.

Since the 180° initial phase angle of the shifter layer 12 must be maintained for maximum depth of focus (DOF) and efficiency of any attenuated phase-shifting mask (APSM) fabricated from shifter blank 8 (See FIG. 7):

$$P1t1+P2t2=0$$

and the change in transmittance dT % caused by the SC1 and NaOH treatments is:

$$T1t1+T2t2=dT\%$$

Therefore, for example, to increase transmittance from 6% to a target transmittance of 18%, a 12% increase, requires the following simple equations to be solved simultaneously:

$$(-0.432)(t1)+(1.038)(t2)=0; \text{ and} \qquad \text{I.}$$

$$(0.048)(t1)+(0.078)(t2)=12 \qquad \text{II.}$$

solving for t2 from equation I.:

$$t2=(0.432)(t1)/1.038$$

substituting t2 into equation II.:

$$(0.048)(t1)+(0.078)(0.432)(t1)/1.038=12$$

solving for t1:

$$t1=149.12 \text{ minutes}$$

computing t2 achieves:

$$t2=62.06 \text{ minutes}$$

For other permissible step two acid and base treatments the above equations may be solved only substituting the P2 ant T2 parameters for the chosen acid or base. Similar P2 and T2 values may be obtained for the second chemical treatments for KOH, or the specific acids selected from the group HF and BOE, respectively.

The present invention modifies the attenuated phase-shifting mask phase angle after its fabrication while previous methods modify the shifter layer phase angle before completion of the attenuated phase-shifting mask fabrication. Further, the present invention can control the phase angle to revert it to the initial desired value of 180° C. while the previous methods, such as the Hashimoto U.S. Pat. No. 5,786,114 for example, do not control the phase angle so that they increase the transmittance of the fabricated attenuated phase-shifting mask while altering the desired initial 180° C. phase angle.

While particular embodiments of the present invention have been illustrated and described, it is not intended to limit the invention, except as defined by the following claims.

We claim:

1. A method of forming a high transmittance attenuated phase-shifting mask, comprising the steps of:

providing an attenuated phase-shifting mask including a shifter layer overlying a transparent substrate said attenuated phase-shifting mask having a first variable transmittance and an initial phase angle;

treating said attenuated phase-shifting mask with an aqueous solution of $NH_4OH{:}H_2O_2$ for a first predetermined time increasing said first variable transmittance to a second transmittance and decreasing said initial phase angle to a second phase angle; and treating said attenuated phase-shifting mask with an acid selected from the group HF and buffered oxide etch (BOE) for a second predetermined time increasing said second variable transmittance to a third, predetermined transmittance and increasing said second phase angle to a third, predetermined phase angle, whereby said third phase angle is substantially equal to said initial phase angle of said shifter layer.

2. The method of claim 1, wherein said transparent substrate is quartz and said shifter layer is MoSiON.

3. The method of claim 1, wherein said aqueous solution of $NH_4OH{:}H_2O_2$ consists essentially of one part $NH_4OH$, one part $H_2O_2$, and five parts $H_2O$ and said treatment of said attenuated phase-shifting mask with said aqueous solution of $NH_4OH:H_2O_2$ is conducted from about 35 to 45° C.

4. The method of claim 1, wherein said aqueous solution of $NH_4OH:H_2O_2$ consists essentially of one part $NH_4OH$, one part $H_2O_2$, and five parts $H_2O$ and said treatment of said attenuated phase-shifting mask with said aqueous solution of $NH_4OH:H_2O_2$ is conducted at about 40° C.

5. The method of claim 1, wherein said shifter layer is from about 700 to 1500 Å thick.

6. The method of claim 1, wherein said initial phase angle of said attenuated phase-shifting mask is 180°.

7. The method of claim 1, wherein said first variable transmittance of said shifter layer is from about 3 to 6%, said second variable transmittance is from about 11 to 15%, and said third variable transmittance is from about 16 to 20%.

8. A method of forming a high transmittance attenuated phase-shifting mask blank, comprising the steps of:
  providing a attenuated phase-shifting mask including a shifter layer overlying a transparent substrate, said overlying a transparent substrate having a first variable transmittance and an initial phase angle;
  treating said overlying a transparent substrate with an aqueous solution of $NH_4OH:H_2O_2$ for a first predetermined time increasing said first variable transmittance to a second transmittance and decreasing said initial phase angle to a second phase angle;
  treating said overlying a transparent substrate with an base selected from the group NaOH and KOH for a second predetermined time increasing said second transmittance to a third, predetermined transmittance and increasing said second phase angle to a third, predetermined phase angle, whereby said third phase angle is substantially equal to said initial phase angle of said attenuated phase-shifting mask.

9. The method of claim 8, wherein said transparent substrate is quartz and said shifter layer is MoSiON.

10. The method of claim 8, wherein said aqueous solution of $NH_4OH:H_2O_2$ consists essentially of one part $NH_4OH$, one part $H_2O_2$, and five parts $H_2O$ and said treatment of said attenuated phase-shifting mask with said aqueous solution of $NH_4OH:H_2O_2$ is conducted from about 35 to 45° C.

11. The method of claim 8, wherein said aqueous solution of $NH_4OH:H_2O_2$ consists essentially of one part $NH_4OH$, one part $H_2O_2$, and five parts $H_2O$ and said treatment of said attenuated phase-shifting mask with said aqueous solution of $NH_4OH:H_2O_2$ is conducted at about 40° C.

12. The method of claim 8, wherein said shifter layer is from about 700 to 1500 Å thick.

13. The method of claim 8, wherein said base is NaOH, and said base treatment is conducted at the following conditions: about 5.6 mole/liter of NaOH at from about 30 to 80° C.

14. The method of claim 8, wherein said initial phase angle of said attenuated phase-shifting mask is 180°.

15. The method of claim 8, wherein said first variable transmittance of said attenuated phase-shifting mask is from about 3 to 6%, said second variable transmittance is from about 11 to 15%, and said third variable transmittance is from about 16 to 20%.

16. A method of forming a high transmittance attenuated phase-shifting mask, comprising the steps of:
  providing an attenuated phase-shifting mask including a MoSiON shifter layer overlying a quartz substrate, the attenuated phase-shifting mask having a first variable transmittance and an initial 180° phase angle;
  treating said attenuated phase-shifting mask with an aqueous solution of $NH_4OH:H_2O_2$ for a first predetermined time increasing said first variable transmittance to a second transmittance and decreasing said initial phase angle to a second phase angle of said attenuated phase-shifting mask, said aqueous solution of $NH_4OH:H_2O_2$ consisting essentially of one part $NH_4OH$, one part $H_2O_2$, and five parts $H_2O$ and said treatment of said attenuated phase-shifting mask with said aqueous solution of $NH_4OH:H_2O_2$ is conducted at about 40° C.;
  chemically treating said attenuated phase-shifting mask for a second predetermined time increasing said second transmittance to a third, predetermined transmittance and increasing said second phase angle to a third, predetermined phase angle.

17. The method of claim 16, wherein said first variable transmittance of said shifter layer is from about 3 to 6%, said second variable transmittance is from about 11 to 15%, and said third variable transmittance is from about 16 to 20%.

18. The method of claim 16, wherein said second chemical treatment is a base treatment selected from the group consisting of KOH and NaOH.

19. The method of claim 16, wherein said second chemical treatment is an acid treatment selected from the consisting of HF and BOE.

\* \* \* \* \*